United States Patent [19]
Houston

[11] Patent Number: 5,917,365
[45] Date of Patent: Jun. 29, 1999

[54] OPTIMIZING THE OPERATING CHARACTERISTICS OF A CMOS INTEGRATED CIRCUIT

[75] Inventor: Theodore W. Houston, Richardson, Tex.

[73] Assignee: Texas Instruments Incorporated, Dallas, Tex.

[21] Appl. No.: 08/825,789

[22] Filed: Apr. 8, 1997

Related U.S. Application Data

[60] Provisional application No. 60/016,639, Apr. 19, 1996.

[51] Int. Cl.⁶ .................................................. H03K 3/01
[52] U.S. Cl. ........................................... 327/534; 327/537
[58] Field of Search .................... 327/530, 534, 327/535, 537, 538, 540, 541–546; 365/154, 156

[56] References Cited

U.S. PATENT DOCUMENTS

| | | | |
|---|---|---|---|
| 5,243,228 | 9/1993 | Maruyama et al. | 327/534 |
| 5,367,489 | 11/1994 | Park et al. | 365/189.11 |
| 5,461,338 | 10/1995 | Hirayama et al. | 327/534 |
| 5,734,604 | 3/1998 | Akamatsu et al. | 365/156 |
| 5,740,102 | 4/1998 | Kawashima | 365/154 |

OTHER PUBLICATIONS

Z. Chen et al. "*Optimization of Quarter Micron MOSFETs for Low Voltage/Low Power Applications*," IEDM 1995 (International Electron Devices Meeting), pp. 63–66.

*Primary Examiner*—My-Trang Nv Ton
*Attorney, Agent, or Firm*—Christopher L. Maginniss; W. James Brady, III; Richard L. Donaldson

[57] ABSTRACT

According to the present invention, a system (10) for optimizing the operating characteristics of a CMOS integrated circuit (12) is provided. The integrated circuit has at least one n-channel transistor (18) and at least one p-channel transistor (16) formed on a common substrate. The n-channel transistor (18) and the p-channel transistor (16) each have a threshold voltage which can be adjusted by varying a voltage bias applied to the common substrate. A control means (14) couples to the common substrate. The control means (14) is operable to apply a varying voltage bias to the common substrate in order to reduce leakage current in the integrated circuit (12) in a standby mode and increase performance of the integrated circuit (12) in an active mode.

20 Claims, 2 Drawing Sheets

OPTIMIZING THE OPERATING CHARACTERISTICS OF A CMOS INTEGRATED CIRCUIT

RELATED APPLICATION

This application is related to copending application Ser. No. 60/016,369 filed Apr. 19, 1996, entitled Optimizing the Operating Characteristics of a CMOS Integrated Circuit, assigned to Texas Instruments Incorporated.

TECHNICAL FIELD OF THE INVENTION

This invention relates generally to integrated circuits, and more particularly to optimizing the operating characteristics of a CMOS integrated circuit.

BACKGROUND OF THE INVENTION

When an electronic circuit is implemented using complementary metal-oxide semiconductor (CMOS) technology, there is a trade-off between performance and power. This trade-off is related to the threshold voltages of the transistors used to form the circuit. The threshold voltage of a typical n-channel transistor is a positive value; the threshold voltage of a typical p-channel transistor is a negative value. Someone of ordinary skill in the art, however, will recognize that in some cases, the threshold voltage of a n-channel transistor can be a negative value and the threshold voltage of a p-channel transistor can be a positive value. Nominally, the threshold voltage of a transistor is the minimum voltage that must be applied to the gate of the transistor in order for the transistor to conduct or "turn on;" otherwise, the transistor is "turned off." However, more specifically, a subthreshold current, which decreases exponentially with gate to source voltage, may still flow through the transistor for a gate voltage below the threshold voltage. A relatively low threshold voltage allows a relatively large amount of drive current to flow through the transistor. A larger drive current allows a faster transition of the transistor's output voltage between high and low. Rapid transition correlates to high performance for the circuit. However, a low threshold voltage also allows a larger amount of leakage current to flow through the transistor when the gate to source voltage is near zero. Leakage current is undesirable because it causes the circuit to unnecessarily consume power. Alternatively, if the transistor has a high threshold voltage, only a small amount of leakage current can flow through the transistor, but drive current will also be limited. This trade-off in power and performance in selection of a threshold voltage becomes more pronounced as supply voltage values are lowered.

The threshold voltage of a fully depleted transistor can be made lower or higher by applying different bias voltages to the substrate on which the transistor is formed, thereby affecting the amount of leakage current which can flow through the transistor. For a typical n-channel transistor, a more positive voltage bias applied at the substrate lowers the threshold voltage of the transistor (usually in the sense that the absolute magnitude of the threshold voltage is reduced, but also in the sense of transitioning through zero to a negative value), thereby allowing more drive current to flow through the transistor but also increasing the subthreshold leakage current. A more negative voltage bias applied at the substrate raises the threshold voltage of a typical n-channel transistor (usually in the sense that the absolute magnitude of the threshold voltage is increased, but also in the sense of transitioning through zero to a positive value), thereby reducing the amount of leakage current that flows through the transistor while also lowering the drive current. For a typical p-channel transistor, a more positive voltage bias applied at the substrate raises the threshold voltage (usually in the sense that the absolute magnitude of the threshold voltage is increased) and a more negative voltage bias lowers its threshold voltage (usually in the sense that the absolute magnitude of the threshold voltage is decreased).

Typically, the performance of, and leakage current in, a prior CMOS circuit depended on both the n-channel and p-channel transistors from which the circuit was formed. These prior circuits were designed so that the threshold voltages of the n-channel and p-channel transistors were sufficient to prevent leakage current above a predetermined level, while also allowing a maximum amount of drive current to flow through the transistors. To prevent leakage current from exceeding the predetermined level, the threshold voltage of the n-channel transistors was generally a positive value and the threshold voltage of the p-channel transistors was generally a negative value, with the two threshold voltages substantially equal in magnitude. The circuit was then designed to operate with the threshold voltages of the transistors within an expected range of the nominal values.

Although it has been recognized that the threshold voltage of fully depleted silicon-on-insulator (SOI) transistors can be adjusted by substrate bias (as discussed above), such bias was not used to improve the trade-off between performance and power in prior CMOS circuits. More specifically, if n-channel and p-channel fully-depleted transistors were formed on the same substrate, a change to the common substrate bias would produce opposite effects in the power/performance trade-offs of the n-channel and the p-channel transistors. For example, if a 10.0 V voltage bias was applied to the substrate to lower the threshold voltage of the n-channel transistors, the threshold voltage of the p-channel transistors was raised. Thus, although more drive current could flow through the n-channel transistors, less drive current could flow through the p-channel transistors. Accordingly, the drive current in the prior CMOS circuit would not be substantially increased. In a similar manner, if a −10.0 V voltage bias was applied to the substrate to raise the threshold voltage of the n-channel transistors, the threshold voltage of the p-channel transistors would be lowered. Consequently, although leakage current flowing through the n-channel transistors was reduced, leakage current in the p-channel transistors would be increased. Thus, the overall leakage current in the CMOS circuit was not substantially reduced. Consequently, in prior CMOS circuits, the use of common substrate voltage was not previously considered effective to adjust threshold voltages between different modes of operation.

Accordingly, a need has arisen for a method for substantially reducing the trade-off between performance and power in a CMOS circuit.

SUMMARY OF THE INVENTION

In accordance with the teachings of the present invention, the disadvantages and problems associated with prior CMOS circuits have been substantially reduced or eliminated.

According to the present invention, a system for optimizing the operating characteristics of a CMOS integrated circuit is provided. The integrated circuit has at least one n-channel transistor and at least one p-channel transistor formed on a common substrate. The n-channel and the p-channel transistors each have a threshold voltage which can be adjusted by varying a voltage bias applied to the common substrate. A control means couples to the common substrate. The control means is operable to apply a varying voltage bias to the common substrate in order to reduce leakage current in the integrated circuit in a standby mode and increase performance of the integrated circuit in an active mode.

An important technical advantage of the present invention is that a CMOS circuit formed according to the present invention can have high performance in one mode of operation and low standby current in another mode. Another important technical advantage of the present invention is that a substrate voltage bias can be used to improve the trade-off between performance and power. Yet another important technical advantage of the present invention is the use of a booster transistor to improve the performance of a CMOS circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
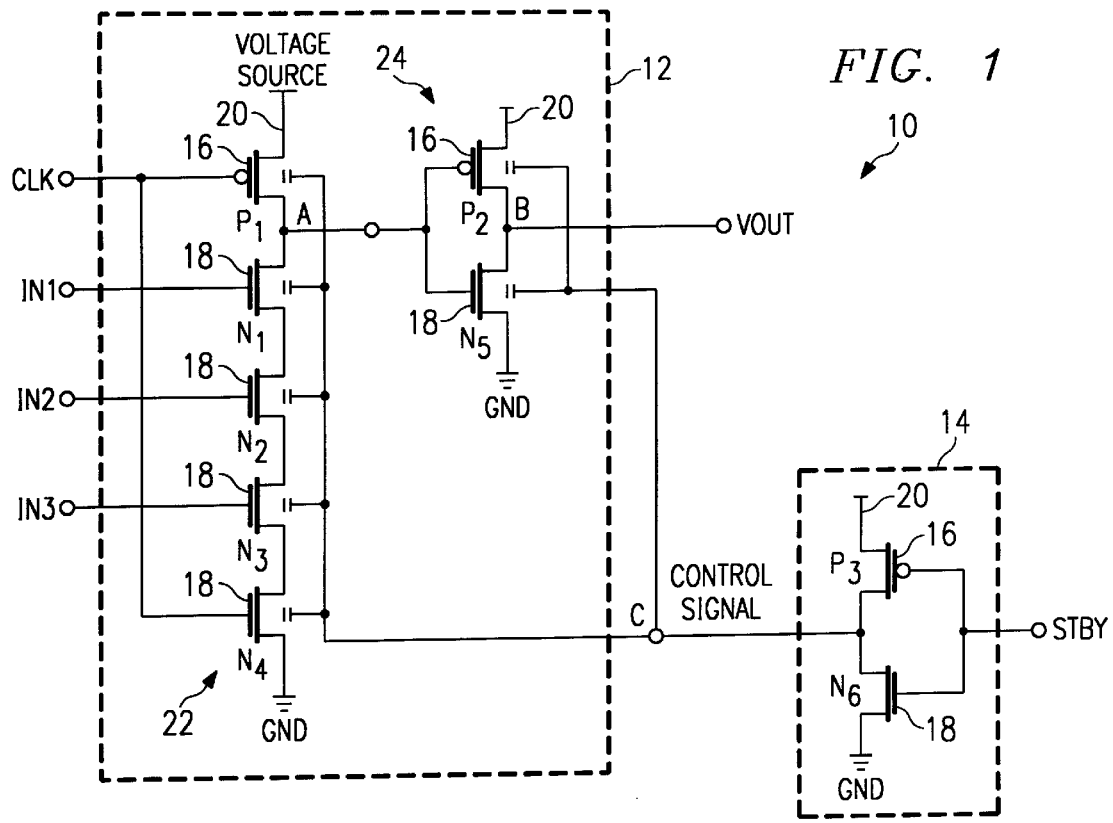
FIG. 1 is an electrical schematic diagram of an exemplary system for optimizing the performance of a CMOS integrated circuit.
Figure 2:
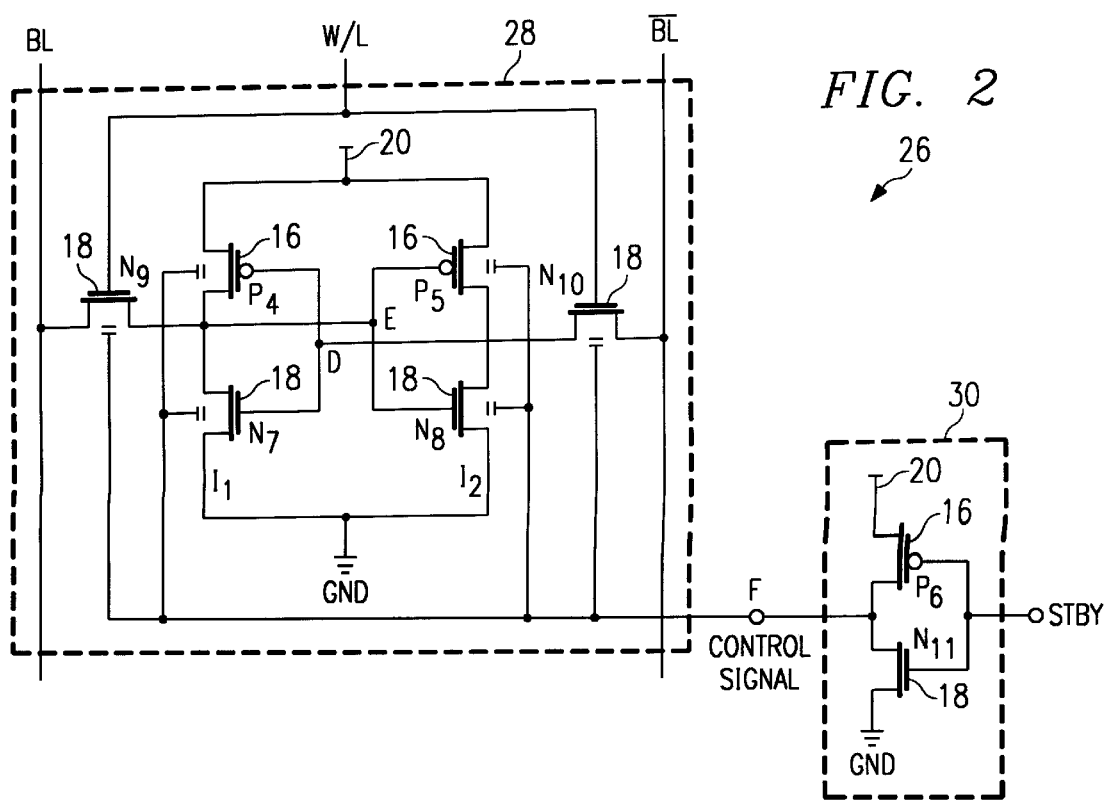
FIG. 2 is an electrical schematic diagram of another exemplary system for optimizing the performance of a CMOS integrated circuit.
Figure 3:
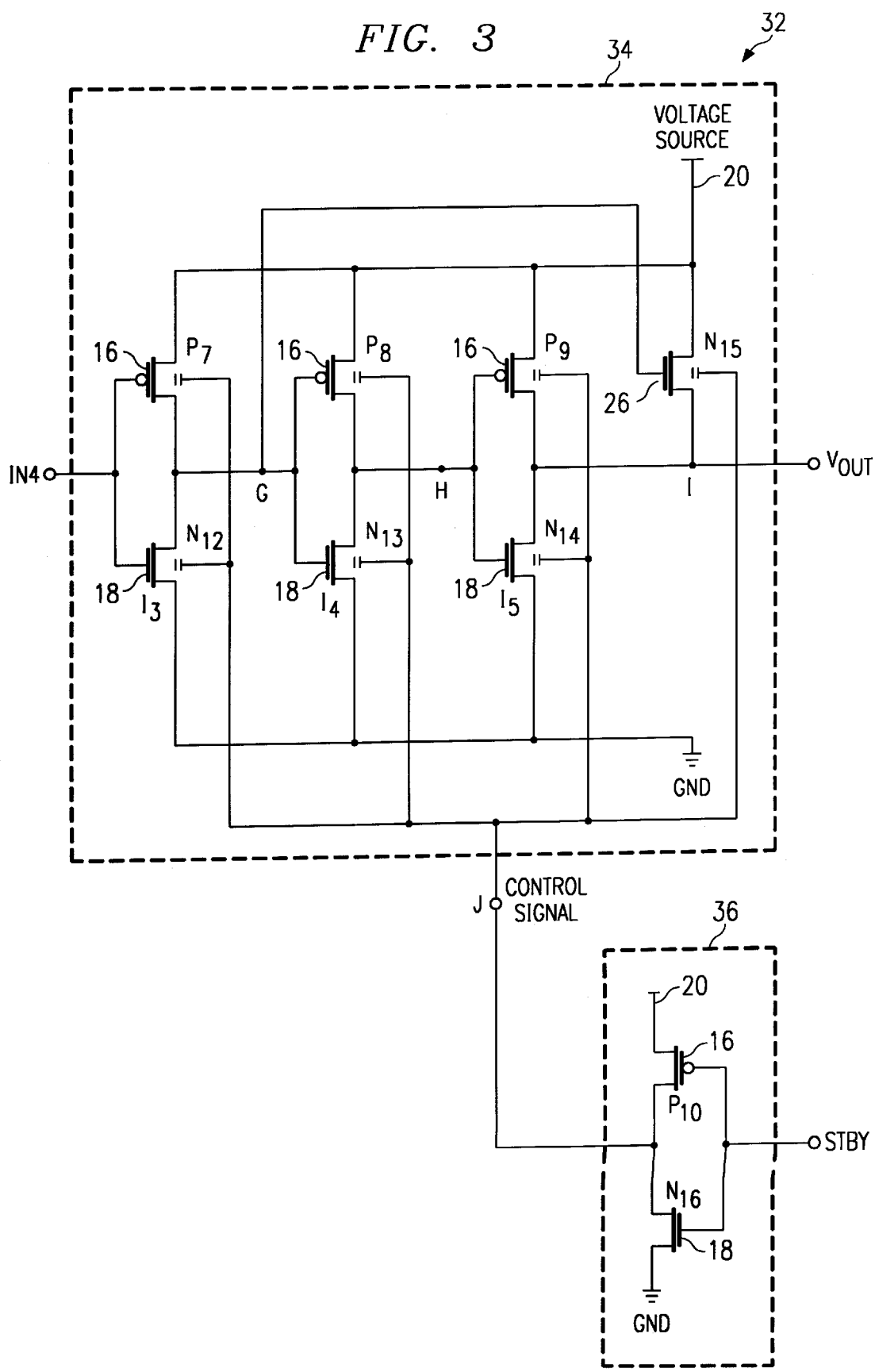
FIG. 3 is an electrical schematic diagram of yet another exemplary system for optimizing the performance of a CMOS integrated circuit.

The preferred embodiment of the present invention and its advantages are best understood by referring to FIGS. 1–3 of the drawings, like numerals being used for like and corresponding parts of the various drawings.

In many cases, a CMOS logic circuit's performance is more dependent on either n-channel or p-channel drive current because the transistors in the logic sequence which is most critical to the circuit's performance (i.e., the "critical path") is dominated by one type of transistor. Because n-channel drive current (per unit width) is typically two to three times greater than p-channel drive current (per unit width), in some cases, the performance of a CMOS logic circuit has been optimized by making delay in the circuit more dependent on n-channel transistors. For example, the performance of a CMOS NAND gate can be made more dependent on n-channel transistors since the critical path in such a gate usually consists of a series of n-channel transistors. In other cases, performance of a CMOS circuit can be optimized by forming the circuit so that delay depends more on p-channel transistors. For example, the performance of a CMOS NOR gate typically depends more on p-channel transistors since the critical path in the NOR gate usually consists of a series of p-channel transistors. However, when performance depends more on p-channel transistors, the width of the p-channel transistors is made wider than that of the n-channel transistors to compensate for the inherently lower drive current of p-channel transistors.

According to an aspect of the present invention, a CMOS circuit and its transistors can be designed so that when a common substrate bias is applied to the circuit to change the threshold voltages of the both the n-channel and p-channel transistors, the trade-off between power and performance is reduced. In other words, the circuit and transistors are formed so that different voltage biases applied to a substrate of the integrated circuit alternately increase the performance and reduce power consumption of the circuit. Thus, in one embodiment, a CMOS circuit is designed so that in an active mode of operation, the circuit performs with the magnitudes of the threshold voltages of the p-channel and n-channel transistors substantially imbalanced (e.g., the magnitude of the $V_t$ of the p-channel transistors being larger than the magnitude of the $V_t$ of the n-channel transistors); then, in a standby mode of operation, a common substrate bias is used to bring the magnitudes of the threshold voltages more into balance (e.g., raise the magnitude of the $V_t$ of the n-channel transistor threshold voltage while lowering the magnitude of the p-channel transistor threshold voltage) so that leakage current is reduced. In another embodiment, a CMOS circuit is designed so that in the standby mode operation, a substantial imbalance of the threshold voltage magnitudes optimizes leakage current in the circuit; then, in active mode, a common substrate bias is used to bring the threshold voltages more into balance to improve the circuit's performance. In yet another embodiment of the invention, one type of transistor, having a lower magnitude threshold voltage than the other type of transistor in the active mode, can be used as a boost transistor to assist in a logic transition that would otherwise depend solely on the other type of transistor.

Furthermore, in another aspect of the present invention, the transistors in a CMOS circuit can be formed to address a specific design consideration for the circuit. Thus, if the performance of the circuit is more critical to its design than power-consumption, the transistors are formed so that, during the standby mode of operation, the absolute magnitudes of the threshold voltages are relatively low, thereby allowing more subthreshold leakage current to flow in the circuit. However, during active mode, the low absolute magnitudes for the threshold voltages allow more drive current to flow through the circuit, thereby increasing performance. On the other hand, if the main design concern for the CMOS circuit is the amount of power that it consumes, then the transistors are formed so that, during the standby mode, the absolute magnitudes of the threshold voltages are relatively high, thereby reducing the subthreshold leakage current. During active mode, however, the high absolute magnitudes of the threshold voltages reduce the flow of drive current. For either the case of performance or power being primarily important, the trade-off of performance and power can be improved by concurrent shifting of the threshold voltages of the n-channel and p-channel transistors between active and standby modes, with appropriate circuit design.

Although this description focuses primarily on the case of changing threshold voltages between active and standby modes of operation, the present invention contemplates the change of threshold voltages in the active mode in order to adjust the speed/power trade-off. The adjustment can be for different selected states (e.g., high speed/high power versus low speed/low power) or to optimize current transistor characteristics as affected by process variations, supply voltage variations, and/or environmental (e.g., temperature) variations.

FIG. 1 is an electrical schematic diagram of an exemplary system 10 for optimizing the performance of a CMOS integrated circuit according to an embodiment of the present invention. System 10 includes a CMOS circuit 12 and a control means 14.

CMOS circuit 12 includes a plurality of fully depleted p-channel transistors 16 (labeled as $P_1$ and $P_2$) and a plurality of fully depleted n-channel transistors 18 (labeled as $N_1$, $N_2$, $N_3$, $N_4$, and $N_5$) formed on a common substrate.

$P_1$, $N_1$, $N_2$, $N_3$, and $N_4$ form a NAND gate 22. $N_1$, $N_2$, $N_3$, and $N_4$, are connected in sequence to $P_1$. In particular, the source of $P_1$ is connected to a voltage source 20, the drain of $N_1$ is connected to the drain of $P_1$, the drain of $N_2$ is connected to the source of $N_1$, the drain of $N_3$ is connected to the source of $N_2$, and the drain of $N_4$ is connected to the source of $N_3$. The source of $N_4$ is connected to ground (GND). Input signals IN1, IN2, and IN3 are connected to the gates of $N_1$, $N_2$, and $N_3$, respectively. A clock signal "CLK" is connected to the gate of $N_4$ and to the gate of $P_1$. Node A between $P_1$ and $N_1$ represents the output for NAND gate 22. When the clock is low, the voltage at Node A is high. If all of the inputs IN1, IN2, and IN3 are high when the clock goes high, the voltage at Node A will go low. Otherwise, if any of the inputs are low, the voltage at Node A will remain high.

$P_2$ and $N_5$ form an inverter 24. The source of $P_2$ is connected to voltage source 20, the drain of $N_5$ is connected to the drain of $P_2$, and the source of $N_5$ is connected to ground (GND). The input for inverter 24 is connected to the gate of $N_5$ and to the gate of $P_2$. This input is connected to the output of NAND gate 22 at Node A. Node B between $P_2$ and $N_5$ represents the output, labeled as $V_{out}$, for both inverter 24 and CMOS circuit 12. If the voltage at Node A is high, $V_{out}$ will be low. Otherwise, if the voltage at Node A is low, $V_{out}$ will be high.

Because inverter 24 inverts the output of NAND gate 22, CMOS circuit 12 functions as an AND gate for inputs IN1, IN2, and IN3. If all inputs are high, then $V_{out}$ will be high. If any input is low, $V_{out}$ will be low.

Control means 14 includes a p-channel transistor 16 (labeled as $P_3$) connected in sequence to a n-channel transistor 18 (labeled as $N_6$). The source of $P_3$ is connected to voltage source 20, the drain of $N_6$ is connected to the drain of $P_3$, and the source of $N_6$ is connected to ground GND. A standby signal "STBY" is connected to the gate of $N_6$ and to the gate of $P_3$. Control means 14 applies a control signal to the common substrate of $P_1$, $P_2$, $N_1$, $N_2$, $N_3$, $N_4$, and $N_5$ at a Node C. The control signal comprises a plurality of different voltages which are operable to adjust the threshold voltages of all the transistors in CMOS circuit 12. More specifically, when the STBY signal is high, control means 14 applies a first voltage bias to the common substrate. When the STBY signal is low, control means 14 applies a second voltage bias. Although control means 14 is illustrated as being connected between voltage source 20 and ground, it should be understood that in alternate embodiments, control means 14 could be connected between other supply voltages. Also, rather than the first and second voltage biases described above, control means 14 could be designed to apply varying levels of voltages in an analog fashion. Control means 14 can be formed on the same chip as CMOS circuit 12, or alternatively, off-chip.

Still referring to FIG. 1, in operation, CMOS circuit 12 is switched between an active mode of operation and a standby mode of operation. During these modes of operation, control means 14 applies different voltage biases to the substrate on which the transistors of CMOS circuit 12 are formed in order to adjust their threshold voltages. The voltage biases, applied at the control signal, reduce leakage current in CMOS circuit 12 or, alternately, improves the performance of CMOS circuit 12.

Thus, in the standby mode of operation, control means 14 applies a first voltage bias to the common substrate of the p-channel and n-channel transistors of CMOS circuit 12. Preferably, the CLK signal is held low during standby, thereby disabling the AND operation of CMOS circuit 12. Control means 14 supplies a first voltage bias of ground potential. In alternative embodiments, control means 14 could supply a different potential, for example, in the range of −10.0 V to ground. The first voltage bias adjusts the threshold voltages of $N_1$, $N_2$, $N_3$, $N_4$, $N_5$, $P_1$, and $P_2$ so that the magnitudes of the threshold voltages for these n-channel and p-channel transistors are substantially the same, thereby minimizing the leakage current flowing through the circuit. For example, a ground voltage bias may adjust the threshold voltage of the n-channel transistors to 0.5 V and the threshold voltage of the p-channel transistors to −0.5 V. Consequently, the power consumed by CMOS circuit 12 is reduced by the application of the first voltage bias.

In the active mode of operation for CMOS circuit 12, control means 14 applies the second voltage bias (VDD) to the common substrate at the control signal. In an alternative embodiment, control means 14 applies other voltages. The CLK signal is used to switch NAND gate 22 from a precharge mode to an evaluation mode, and vice versa. In precharge mode, a low CLK signal is applied to the gates of $P_1$ and $N_4$. The low CLK signal turns on $P_1$ so that the current flowing through $P_1$ precharges Node A to the same voltage potential as voltage source 20. Because the low CLK signal also turns off $N_4$, the NAND operation of NAND gate 22 is disabled; the signal appearing at Node A will be high, regardless of the values of IN1, IN2, and IN3. Consequently, the AND operation of CMOS circuit 12 is disabled. In evaluation mode, a high CLK signal is applied to the gates of $P_1$ and $N_4$. The high CLK signal turns off $P_1$ so that no drive current flows from voltage source 20 to Node A. The high CLK signal turns on $N_4$, thus enabling the NAND operation of NAND gate 22 and also the AND operation of CMOS circuit 12). If any of inputs IN1, IN2, and IN3 are low, current cannot flow from Node A to GND, and signal at Node A remains high. Inverter 24 inverts the high signal at Node A to a low signal at $V_{out}$. On the other hand, if all of the inputs IN1, IN2, and IN3 are high, each of transistors $N_1$, $N_2$, and $N_3$ will be turned on so that drive current can flow from Node A to GND. Consequently, the high precharged voltage of Node A can discharge through $N_1$, $N_2$, $N_3$, and $N_4$ so that the signal at Node A is pulled low. The low signal at Node A is inverted to a high signal at $V_{out}$.

In light of the above, the drive current flowing through the n-channel transistors 18 is critical to the performance of CMOS circuit 12. Stated differently, the speed by which the voltage signal at Node A is pulled low in the active mode depends almost exclusively upon the drive current of $N_1$, $N_2$, $N_3$, and $N_4$. Thus, in the active mode, CMOS circuit 12 performs with the magnitudes of the p-channel and n-channel transistors substantially imbalanced (i.e., the magnitude of the p-channel transistors is larger than the magnitude of the n-channel transistors). More specifically, the second voltage bias, which may have a value in the range between zero and +10 volts, is applied to lower the threshold voltage of $N_1$, $N_2$, $N_3$, and $N_4$. For example, a voltage bias of 3.3 V may change the threshold voltage of the n-channel transistors to 0.2 V, thereby increasing the amount of drive current flowing through CMOS circuit 12 from pre-charged Node A to GND. Consequently, the voltage at Node A will more rapidly transition from high to low. At the same time, the second voltage bias may change the threshold voltage of $P_1$ and $P_2$ to −0.8 V so that the leakage current flowing through these p-channel transistors 16 is reduced, with some sacrifice in drive current. $P_2$ is also important to the ultimate performance of CMOS circuit 12. However, the width of $P_2$ can be adjusted so that the transition at Vout (caused by the change at Node A) will not be drastically affected. Because of layout and capacitance effects, the width of $P_2$ can more readily be increased than could the widths of $N_1$, $N_2$, $N_3$, and $N_4$.

Accordingly, the operation of CMOS circuit 12 is optimized by the application of substrate voltage bias at the control signal.

Furthermore, if the main design concern for CMOS circuit 12 is the power consumed by the circuit, then the p-channel transistor 16 and the n-channel transistors 18 are formed so that the absolute magnitudes of the threshold voltages are relatively high in standby mode so that power consumption is significantly reduced. For example, the n-channel transistors 18 may have a threshold voltage of 1.0 V in standby and 0.5 V in active; the p-channel transistors 16 may have a threshold voltage of −1.0 V in standby and −1.5 V in active. On the other hand, if the main design concern for CMOS circuit 12 is the performance of the circuit, then $N_1$, $N_2$, $N_3$, $N_4$, and $P_1$ are formed so that the absolute magnitudes of the threshold voltages are relatively low in standby mode. For example, the n-channel transistors 18 may have a threshold voltage of 0.3 V in standby and zero V in active; the p-channel transistors 16 may have a threshold voltage of −0.3 V in standby and −0.6 V in active. Consequently, although the circuit may consume more power in standby mode, the performance of the circuit is improved during active mode because the signal at $V_{out}$ can be more rapidly pulled from high to low by the increased drive current flowing through the n-channel transistors 18.

The settings in active and standby modes for optimization of the AND circuit of FIG. 1 are exemplary. Other optimization configurations are possible. For example, depending on the relative device widths and transistor characteristics, leakage current in standby mode may be minimized by increasing the p-channel threshold voltages at the sacrifice of n-channel leakage current. Such is the case when the number of n-channel transistors in series, all turned off, effectively reduces the leakage in that path.

According to another embodiment, the method of circuit optimization comprises evaluating the performance and leakage current for different related sets of n-channel and p-channel threshold voltages. The circuit configuration (interconnect and device widths) and nominal threshold voltages are then chosen to optimize the trade-off of power and performance with the controlled variation of the threshold voltages from the nominal values by the setting of the substrate bias.

FIG. 2 is an electrical schematic diagram of exemplary system 26 for optimizing the performance of a CMOS integrated circuit. System 26 includes a CMOS circuit 28 and a control means 30.

CMOS circuit 28 is a memory cell. CMOS circuit 28 includes a plurality of fully depleted p-channel transistors 16 (labeled as $P_4$ and $P_5$) and a plurality of fully depleted n-channel transistors 18 (labeled as $N_7$, $N_8$, $N_9$, and $N_{10}$). These p-channel transistors 16 and n-channel transistors 18 are formed on a common substrate. $P_4$ and $N_7$ form a first inverter $I_1$, and $P_5$ and $N_8$ form a second inverter $I_2$. The operation of $I_1$ and $I_2$ is substantially similar to the operation of inverter 24 described with reference to FIG. 1. A node D connects the input of $I_1$ and the output of $I_2$. A node E connects the input of $I_2$ and the output of $I_1$. $N_9$ and $N_{10}$ are access transistors, connecting node E with a BL column and node D with a $\overline{BL}$ column, respectively. The gates of $N_9$ and $N_{10}$ are connected to a word line "W/L." The W/L signal is used to control access to the memory cell for the reading and writing operations of the memory cell.

Control means 30 includes a p-channel transistor 16 (labeled as $P_6$) connected in sequence to a n-channel transistor 18 (labeled as $N_{11}$). Control means 30 applies a control signal to the common substrate of $P_4$, $P_5$, $N_7$, $N_8$, $N_9$, and $N_{10}$ at a Node F. The operation of control means 30 is substantially similar to the operation of control means 14 described above with reference to FIG. 1.

Still referring to FIG. 2, in operation, CMOS circuit 28 is switched between an active mode of operation and a standby mode of operation. During these modes of operation, control means 30 applies different voltage biases to the substrate on which the transistors of CMOS circuit 28 are formed in order to adjust their threshold voltages. The voltage biases, applied at the control signal, reduce leakage current in CMOS circuit 28 or, alternately, improves the performance of CMOS circuit 28.

In the standby mode of operation, control means 30 applies a first voltage bias to the common substrate of the p-channel and n-channel transistors of CMOS circuit 28. Preferably, the W/L signal is held low during standby, thereby disabling the reading and writing operations of the memory cell. The first voltage bias preferably has a potential −10 to zero volts. The first voltage bias adjusts the threshold voltages of $N_7$, $N_8$, $N_9$, $N_{10}$ $P_4$, and $P_5$ so that the threshold voltage for the n-channel transistors is raised and the threshold voltage for the p-channel transistors is lowered. Since leakage current is mostly determined by the n-channel transistors, the leakage current flowing through the circuit is reduced. For example, a −7 V voltage bias may change the threshold voltage of the n-channel transistors to 1.0 V and the threshold voltage of the p-channel transistors to −1.0 V. Consequently, the power consumed by the memory cell is reduced by the application of the first voltage bias.

In the active mode of operation for CMOS circuit 30, control means 30 applies the second voltage bias to the common substrate at the control signal. When the W/L signal is high, $N_9$ and $N_{10}$ are turned on so that drive current flows through Node E between $N_9$ and the BL column and through Node F between $N_{10}$ and the $\overline{BL}$ column, thereby allowing data to be written into or read out of the memory cell. When the W/L signal is low, data cannot be written into or read out of the memory cell.

From the above, the drive current flowing through the n-channel transistors 18 is critical to the performance of CMOS circuit 12. Stated differently, the speed by which the voltage signals at Node D, Node E, the BL column, and the $\overline{BL}$ column are pulled low or high in the active mode depends almost exclusively upon the drive current of $N_9$ and $N_{10}$, recognizing that the drive current in $N_7$ and $N_8$ is greater than the drive current in $N_9$ and $N_{10}$. Thus, in the active mode, CMOS circuit 28 performs with the magnitudes of the p-channel transistors ($P_4$ and $P_5$) drive currents and n-channel transistors ($N_7$ and $N_8$) drive currents substantially imbalanced (i.e., the magnitude of the n-channel transistor drive currents is larger than the magnitude of the p-channel transistor drive currents). More specifically, the second voltage bias, which may have a value in the range between zero and +10 volts, is applied to lower the threshold voltage of $N_9$ and $N_{10}$. For example, a voltage bias of 7 V may change the threshold voltage of these n-channel transistors to 0.5 V, thereby increasing the amount of drive current flowing through $N_9$ and $N_{10}$. Consequently, the voltages at Node D, Node E, the BL column, and the $\overline{BL}$ column will more rapidly transition from high to low.

Although the second voltage bias may change the threshold voltage of $P_4$ and $P_5$ to -1.2 V so that drive current through these p-channel transistors 16 is reduced, these transistors are not as important to the ultimate performance of CMOS circuit 28. In addition, the width of the transistors in circuits peripheral to CMOS circuit 28 (e.g., wordline drivers) can be adjusted to further improve performance of a memory system which incorporates CMOS circuit 28. More specifically, the n-channel and the p-channel device widths can be designed to optimize performance with the threshold voltages selected for the active mode of the memory cell.

Accordingly, the operation of CMOS circuit 28 is optimized by the application of substrate voltage bias at the control signal.

FIG. 3 is an electrical schematic diagram of yet another exemplary system 32 for optimizing the performance of a CMOS integrated circuit. System 32 includes a CMOS circuit 34 and a control means 36. The following description for FIG. 3 illustrates how one type of transistor can be used as a boost for the other type of transistor when the performance of a CMOS circuit would not otherwise depend predominantly upon only one type of transistor.

CMOS circuit 34 includes a plurality of inverters (labeled as $I_3$, $I_4$, and $I_5$) and an n-channel boost transistor $N_8$. Each inverter includes a fully depleted p-channel transistor 16 (labeled as $P_7$, $P_8$, and $P_9$) and a fully depleted n-channel transistor 18 (labeled as $N_{12}$, $N_{13}$, and $N_{14}$). The source of each p-channel transistor 16 in the inverters is connected to a voltage source 20. The drain of each p-channel transistor 16 is connected to the drain of the n-channel transistor 18 of the same inverter. The source of the n-channel transistor in each of $I_3$, $I_4$, and $I_5$ is connected to GND. An input signal IN4 is connected to the gates of $P_7$ and $N_{12}$ of the first inverter, $I_3$. The remaining inverters, $I_4$ and $I_5$, are connected in sequence to $I_3$ so that the output of one inverter serves as the input for the next inverter. More specifically, the output of $I_3$, appearing at a Node G, is connected to the gates of $P_9$ and $N_{13}$ of the second inverter, $I_4$. The output of $I_4$, appearing at a Node H, is connected to the gates of $P_9$ and $N_{14}$ of the last inverter in the series, $I_5$. The output of $I_5$ appears at a Node I in CMOS circuit 34. The operation of $I_3$, $I_4$, and $I_5$ is substantially similar to the operation of inverter 24 described with reference to FIG. 1. Node I represents the output, labeled as $V_{out}$, for circuit 34. The boost transistor, labeled as $N_{15}$, is connected in parallel, between voltage source 20 and Node I, with the p-channel transistor ($P_9$) of $I_5$. The p-channel and n-channel transistors in CMOS circuit 30 can be formed on a common substrate.

Control means 36 includes a fully depleted p-channel transistor 16 (labeled as $P_{10}$) connected in sequence to a fully depleted n-channel transistor 18 (labeled as $N_{16}$). Control means 36 applies a control signal to the common substrate of $P_7$, $P_8$, $P_9$, $N_{12}$, $N_{13}$, $N_{14}$, and $N_{15}$ at a Node J. The operation of control means 36 is substantially similar to the operation of control means 14 and 30 described above with reference to FIGS. 1 and 2, respectively.

With further reference to FIG. 3, in operation, CMOS circuit 34 can be operated in an active mode or a standby mode. The voltage biases are applied at the control signal in order to adjust the threshold voltages of the p-channel transistors 16 and the n-channel transistors 18.

In the standby mode of operation for CMOS circuit 34, a first voltage bias is applied to the common substrate at Node J. The first voltage bias, which preferably has a potential between -10 to zero volts, adjusts the threshold voltages of $P_7$, $P_8$, $P_9$, $N_{12}$, $N_{13}$, $N_{14}$, and $N_{15}$ so that the absolute magnitudes of the threshold voltages for these transistors are the same, thereby minimizing the leakage current flowing through the circuit. Accordingly, the power consumed by CMOS circuit 34 is reduced.

In the active mode of operation, a second voltage bias, which preferably has a potential between 0 and +10 volts, is applied at Node J. The second voltage bias lowers the threshold voltage of the n-channel transistors 16 in CMOS circuit 34. Consequently, more drive current can flow through the n-channel transistors to rapidly pull the output signals of the inverters (appearing at Nodes G, H, and I) from high to low. The second voltage bias also raises the absolute magnitude of the threshold voltage of the p-channel transistors 16, thereby allowing less drive current to flow in these transistors.

In prior CMOS inverters, the drive currents of the p-channel and the n-channel transistors would be equally important to the performance of the circuit depending on whether transition is from low to high or high to low. As just previously explained, however, the second voltage does not allow more drive current to flow in both types of transistors in CMOS circuit 34. Nonetheless, according to the present invention, additional transistors can be added to a CMOS circuit so that the overall performance of the circuit is optimized. Thus, referring to FIG. 3, $N_{15}$ has been added to the last inverter in the sequence, $I_5$, to enhance that inverter's performance. A comparison of the operations of $I_3$ and $I_5$ in the active mode of CMOS circuit 34 more clearly shows the advantage of adding $N_{15}$.

With respect to $I_3$, if a low signal is applied at IN4, $P_7$ is turned on and $N_{12}$ is turned off. Thus, drive current flows from voltage source 20 through $P_7$ so that the output of $I_3$ at Node G is high. In this case, the amount of drive current flowing through $P_7$ is limited because the second voltage bias applied at Node J raises the absolute magnitude of the threshold voltage of the p-channel transistors 16 in CMOS circuit 34. Consequently, the signal appearing at Node G is not rapidly brought to a high value.

The high signal at Node G turns off $P_8$ and turns on $N_{13}$ of the next inverter, $I_4$. The output of $I_4$ at Node H is low because drive current flows through $N_{13}$ to bring the voltage at Node H to GND or 0. It should be noted that because the threshold voltage of $N_{13}$ is lowered by the second voltage bias, the signal appearing at Node H is brought to a low value fairly rapidly.

With respect to $I_5$, the low signal at Node H turns on $P_9$ and turns off $N_{14}$. Drive current flows from voltage source 20 through $P_9$ to raise the voltage at Node I. In addition, the high signal appearing at Node G turns on $N_{15}$ so that drive current also flows through $N_{15}$ to Node I, giving an initial boost to the transition of node I from low to high. Consequently, the transition of the output of $I_5$ from low to high is not as dependent on the threshold voltage of p-channel transistor $P_9$ as it would be without boost transistor $N_{15}$.

Although the present invention and its advantages have been described in detail, it should be understood that various changes, substitutions, and alterations can be made herein without departing from the spirit and scope of the invention as defined by the appended claims.

What is claimed is:

1. A system for optimizing the operating characteristics of a CMOS integrated circuit, comprising:

the integrated circuit having at least one n-channel transistor and at least one p-channel transistor formed on a common substrate, the n-channel and the p-channel transistors each having a threshold voltage which can be adjusted by varying a voltage bias applied to the common substrate; and a control means coupled to the common substrate and operable to apply a varying voltage bias to the common substrate.

2. The system of claim 1, wherein the n-channel and the p-channel transistors are silicon-on-insulator transistors.

3. The system of claim 2, wherein the n-channel and the p-channel transistors are fully depleted.

4. The system of claim 1, wherein the integrated circuit comprises a logic gate or a memory cell.

5. The system of claim 1, wherein the control means comprises an inverter having an output connected to the common substrate.

6. The system of claim 1, wherein the control means comprises a p-channel transistor connected in series to an n-channel transistor.

7. The system of claim 1, wherein the integrated circuit comprises a NAND gate connected to an inverter.

8. The system of claim 1, wherein the integrated circuit alternately operates in a first mode of operation and a second mode of operation, the first mode of operation characterized by lower power consumption than the second mode of operation.

9. The system of claim 8, wherein:
the threshold voltage of the n-channel transistor is approximately 0.3 volts in the first mode of operation and approximately 0.5 volts in the second mode of operation; and
the threshold voltage of the p-channel transistor is approximately −0.7 volts in the first mode of operation and −0.5 volts in the second mode of operation.

10. The system of claim 8, wherein:
the threshold voltage of the n-channel transistor is approximately −0.1 volts in the first mode of operation and approximately 0.2 volts in the second mode of operation; and
the threshold voltage of the p-channel transistor is approximately −0.5 volts in the first mode of operation and −0.3 volts in the second mode of operation.

11. The system of claim 1, further comprising a booster transistor connected to one of the n-channel and p-channel transistors.

12. A CMOS integrated circuit operating alternately in a first state and a second state, comprising:
at least one n-channel transistor formed on a substrate, the n-channel transistor having an adjustable n-channel threshold voltage; and
at least one p-channel transistor formed on the substrate, the p-channel transistor having an adjustable p-channel threshold voltage, the n-channel threshold voltage and the p-channel threshold voltage being adjusted to be more positive in the first state relative to the n-channel threshold voltage and the p-channel threshold voltage in the second state.

13. The integrated circuit of claim 12, wherein the integrated circuit comprise a logic gate or a memory cell.

14. The integrated circuit of claim 12, wherein the switching characteristics of the integrated circuit are faster in the first state relative to the switching characteristics in the second state and the power consumption characteristics of the integrated circuit are lower in the second state relative to the power consumption characteristics in the first state.

15. The integrated circuit of claim 12, wherein the switching characteristics of the integrated circuit are faster in the second state relative to the switching characteristics in the first state, and the power consumption characteristics of the integrated circuit are lower in the second state relative to the power consumption characteristics in the first state.

16. A method for improving the operating characteristics of a CMOS integrated circuit having at least one n-channel transistor and at least one p-channel transistor formed on a common substrate, the n-channel and the p-channel transistors each having a threshold voltage which can be adjusted, comprising the steps of:
applying a first voltage bias to the common substrate in a first mode of operation to adjust the threshold voltages of the n-channel and the p-channel transistors so that leakage current in the CMOS integrated circuit is reduced relative to a second mode of operation; and
applying a second voltage bias to the common substrate in the second mode of operation to adjust the threshold voltages of the n-channel and p-channel transistors so that the switching speed of the CMOS integrated circuit is improved relative to the first mode of operation.

17. The method of claim 16, wherein the steps of applying first and second voltage biases comprise the step of applying a voltage bias in the range of zero to 10 volts.

18. The method of claim 16, wherein the steps of applying first and second voltage biases comprise the step of applying a voltage bias in the range of −10 to 10 volts.

19. The method of claim 16, wherein either the step of applying the first voltage bias or the step of applying the second voltage bias adjusts the threshold voltages of the n-channel and p-channel transistors so that the magnitude of the threshold voltages are substantially the same.

20. The method of claim 16, wherein the steps of applying first and second voltage biases comprise the step of applying a voltage bias in the range of supply voltages to the integrated circuit.

* * * * *